US012603122B2

(12) United States Patent
Kim

(10) Patent No.:    US 12,603,122 B2
(45) Date of Patent:    Apr. 14, 2026

(54) PARALLEL PIPE LATCH FOR MEMORY ACCESS OPERATIONS

(71) Applicant: Micron Technology, Inc., Boise, ID (US)

(72) Inventor: Jaeil Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 177 days.

(21) Appl. No.: 17/900,075

(22) Filed: Aug. 31, 2022

(65) Prior Publication Data

US 2024/0071471 A1    Feb. 29, 2024

(51) Int. Cl.
*G11C 11/409*    (2006.01)
*G06F 11/10*    (2006.01)
*G11C 11/408*    (2006.01)

(52) U.S. Cl.
CPC ........ G11C 11/409 (2013.01); G06F 11/1044 (2013.01); G11C 11/4085 (2013.01)

(58) Field of Classification Search
CPC .............. G11C 11/409; G11C 11/4085; G11C 2029/0411; G11C 7/1051; G11C 7/1078; G11C 7/18; G11C 29/52; G06F 11/1044; G06F 11/1048
See application file for complete search history.

(56) References Cited

U.S. PATENT DOCUMENTS

| | | | | |
|---|---|---|---|---|
| 2004/0221098 A1* | 11/2004 | Ito | ......................... | G11C 11/406 |
| | | | | 711/106 |
| 2009/0063786 A1* | 3/2009 | Oh | ...................... | G06F 13/1684 |
| | | | | 711/148 |
| 2012/0192035 A1* | 7/2012 | Nakanishi | ........... | G06F 11/1004 |
| | | | | 714/766 |
| 2014/0258811 A1* | 9/2014 | Liu | ..................... | G06F 11/1008 |
| | | | | 714/766 |
| 2016/0224419 A1* | 8/2016 | Takai | .................... | G06F 3/0679 |
| 2024/0069589 A1* | 2/2024 | Mazumder | ................ | G06F 1/10 |
| 2024/0070058 A1* | 2/2024 | Kim | .................... | G11C 11/2273 |

* cited by examiner

*Primary Examiner* — Khamdan N. Alrobaie

(74) *Attorney, Agent, or Firm* — Schwegman Lundberg & Woessner, P.A.

(57)    ABSTRACT

A memory device comprises memory and control circuitry. The control circuitry can receive a command to access the memory. Responsive to receiving the command to access the memory, the control circuitry can provide command data of the command to pipe latch circuitry and error correction code (ECC) circuitry. The memory device further includes pipe latch circuitry to receive command data of the command from the control circuitry and maintain the command data for a period of time of a duration longer than error calculation time of the ECC circuitry.

20 Claims, 8 Drawing Sheets

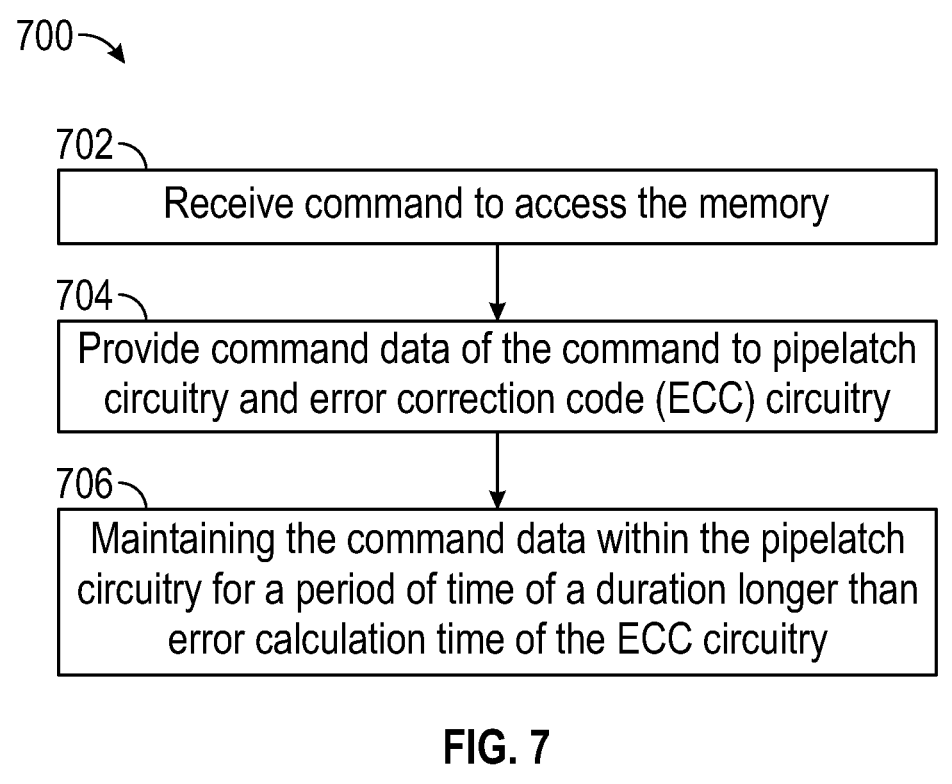

700

702

Receive command to access the memory

704

Provide command data of the command to pipelatch circuitry and error correction code (ECC) circuitry

706

Maintaining the command data within the pipelatch circuitry for a period of time of a duration longer than error calculation time of the ECC circuitry

FIG. 7

PARALLEL PIPE LATCH FOR MEMORY ACCESS OPERATIONS

TECHNICAL FIELD

Embodiments pertain to memory devices. Some embodiments pertain to error correction code (ECC) in memory devices.

BACKGROUND

Memory devices for computers or other electronic devices may be categorized as volatile and non-volatile memory. Volatile memory requires power to maintain its data, and includes random-access memory (RAM), dynamic random-access memory (DRAM), Holographic RAM (HRAM), or synchronous dynamic random-access memory (SDRAM), among others. Non-volatile memory can retain stored data when not powered, and includes, without limitation, ferroelectric random access memory (FeRAM) devices, flash memory, read-only memory (ROM), electrically erasable programmable ROM (EEPROM), static RAM (SRAM), erasable programmable ROM (EPROM), resistance variable memory, phase-change memory, three-dimensional cross-point memory, storage class memory, resistive random-access memory (RRAM), and magnetoresistive random-access memory (MRAM), among others. Persistent memory is an architectural property of the system where the data stored in the media is available after system reset or power-cycling. In some examples, non-volatile memory media may be used to build a system with a persistent memory model.

Memory devices can be accessed for read and write operations and error code correction circuitry can be provided to perform corrections. The error code circuitry may be the source of delays that affect memory access capabilities of the memory device. There is a general need to reduce or eliminate issues caused by this delay.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 7 illustrates a method for accessing memory according to various embodiments.

DETAILED DESCRIPTION

Figure 1:
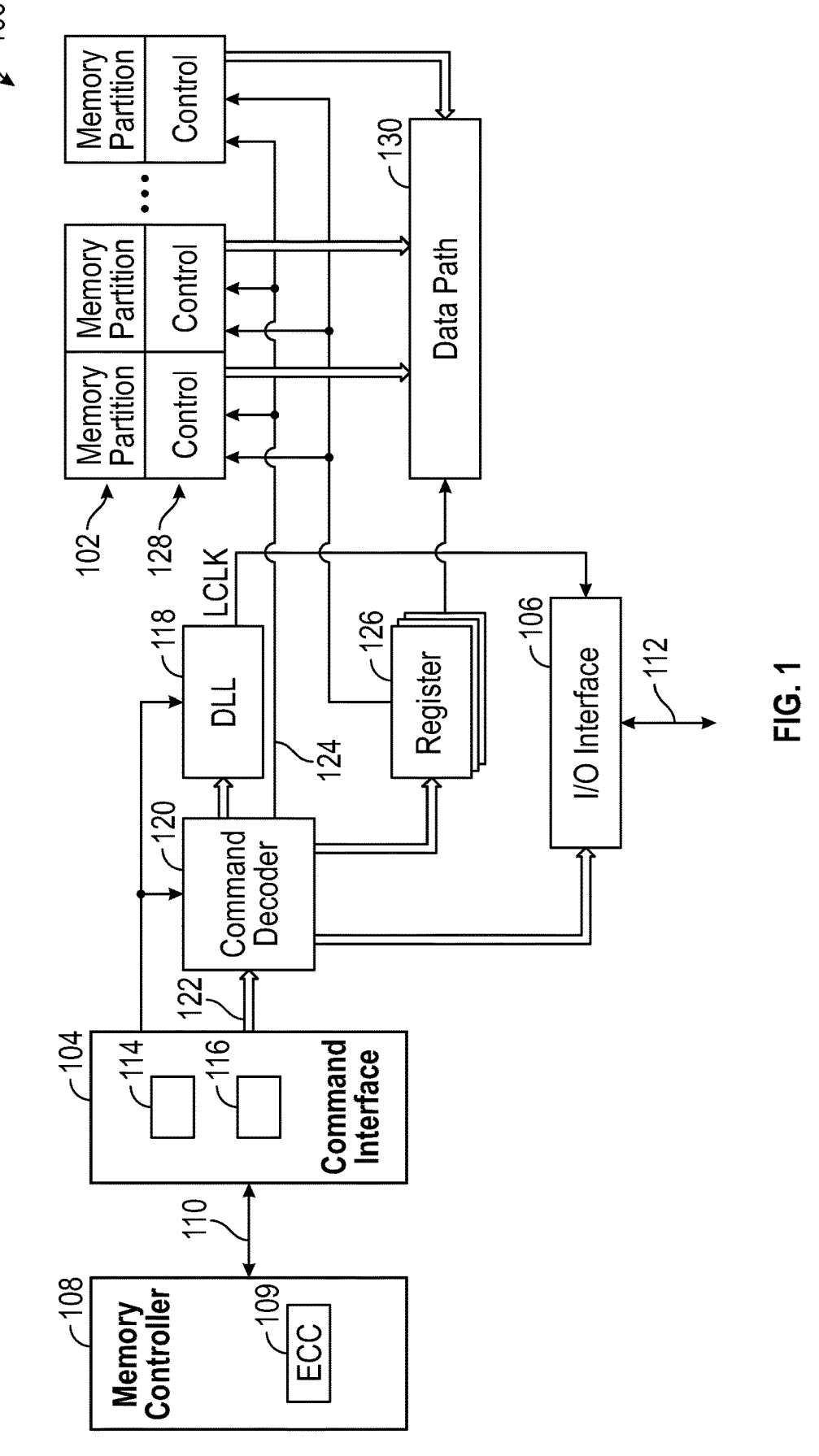
FIG. 1 illustrates generally an example block diagram of a memory device.

FIG. 1 illustrates generally a simplified block diagram of various features of a memory device 100. The block diagram of FIG. 1 can be a functional block diagram illustrating various functions of the memory device 100. In accordance with one embodiment, the memory device 100 may be a random access memory (RAM) device, a dynamic RAM (DRAM) device, a static RAM (SRAM) device (including a double data rate SRAM device), a ferroelectric RAM (Fe-RAM), holographic RAM (HRAM) flash memory, and/or a phase change memory (PCM) device and/or other chalcogenide-based memory, such as self-selecting memories (SSM). Moreover, the memory cells of the memory device can each have a corresponding logic storing device (e.g., a capacitor, a resistor, or a chalcogenide device).

In some examples, the memory device 100 comprises a ferroelectric RAM (FeRAM), which can utilize two separate operations in the performance of reading or writing functions. These two separate operations can include sensing and programming operations that comprise setting different access lines (e.g., digit lines, plate lines, word lines) to relatively high or low levels, as described with reference to FIG. 1.

In an example, the memory device 100 comprises a cell, or array of cells, arranged according to a planar architecture, with discrete cells or memory elements located at crossings of Word Lines (WL) and Bit Lines (BL). In a two-dimensional array, alternating decks of WL and BL can be provided or layered to provide a 3D memory array.

In some examples, memory cells may store an electrical charge representative of the programmable logic states in a capacitive memory element. For example, a charged and uncharged capacitor of a memory cell may represent two logic states, respectively, or a positively charged and a negatively charged capacitor of a memory cell may represent two logic states, respectively. In some examples, such as FeRAM architectures, a memory cell may include a ferroelectric capacitor having a ferroelectric material as an insulating layer between terminals of the capacitor. Different levels of polarization of a ferroelectric capacitor may represent different logic states (e.g., supporting two or more logic states in a respective memory cell). Ferroelectric materials have non-linear polarization properties The memory device 100 can include memory partitions 102, and each memory partition 102 can include one or more cell arrays (i.e., memory arrays). Various configurations, organizations, and sizes of a memory partition 102 on the memory device 100 can be used depending on the application and design of the overall system. For example, each of the memory partitions 102 can comprise a respective different die in a stacked memory device. In such a device, at least one die can be a primary die that interfaces with a host, or a memory controller 108, using an inter-device bus 110, and one or more other dies can be secondary dies that interface with the primary die using an intra-package bus 124. Arrays can also be sub-divided into multiple separately-addressable portions (e.g., into multiple channels, banks, ranks, etc.). Alternatively, a memory system can include multiple memory devices such as the memory device 100 of FIG. 1, where each memory device represents a separately-addressable sub-division (e.g., rank, etc.) of the memory capacity of the system. Accordingly, a memory device or a memory system with multiple memory devices, ranks, channels, banks or the like can include multiple terminals (e.g., clock terminals, CMD/ADD terminals, I/O terminals, etc.) that are dedicated to one or more, but less than all of, the separately-addressable portions. For example, a multi-channel memory device can include multiple terminals, each corresponding to one of the multiple channels of memory.

The memory device 100 can include a command interface 104 and an input/output interface 106. The command interface 104 can receive various signals from an external host device, such as a processor or controller (e.g., a memory controller 108) external to the memory device 100. In some embodiments, an inter-device bus 110 (or a signal path or a group of signal paths) can, individually or in combination, allow for bidirectional transmission of signals between the command interface 104 and the processor or controller (e.g., the memory controller 108).

In an example, the memory device 100 can include a second bus 112 (or a signal path or another group of signal paths) that can, individually or in combination, allow for bidirectional transmission of signals, including, for example, data signals, between the input/output interface 106 and, for example, the processor or controller (e.g., the memory controller 108). Thus, the processor or controller, for example, the memory controller 108, can provide various signals to the memory device 100 to facilitate transmission and receipt of data to be written to or read from the memory device 100.

In an example, the command interface 104 can include or use a number of circuits, such as a clock input circuit 114 and a command/address input circuit 116, to ensure proper handling of the received signals. The command interface 104 can receive one or more clock signals from an external device, such as the memory controller 108. The command interface 104 can receive commands (e.g., read command, write command, etc.), that can be entered on, e.g., positive edges of the clock signal, and can receive data, such as can be transmitted or received on positive and/or negative edges of the clock signal. In some examples, the commands can have a variable clock length (e.g., one or more clocks can be used to receive the commands).

The clock input circuit 114 can receive the one or more clock signals and generate an internal clock signal CLK therefrom. In some embodiments, the internal clock signal CLK is supplied to an internal clock generator 118, such as a delay locked loop (DLL) circuit. The internal clock generator 118 generates a phase-controlled internal clock signal LCLK based on the received internal clock signal CLK. The phase controlled internal clock signal LCLK can be provided to the input/output interface 106, for instance, and can be used as a timing signal for determining an output timing of read data.

The internal clock signal CLK can be provided to various other components within the memory device 100 and can be used to generate various additional internal clock signals. For instance, the internal clock signal CLK can be provided to a command decoder 120. The command decoder 120 can receive command signals from the command bus 122 and can decode the command signals to provide various internal commands. For example, the command decoder 120 can provide command signals to the internal clock generator 118 using an internal bus to coordinate generation of the phase-controlled, internal clock signal LCLK. In some examples, the phase-controlled, internal clock signal LCLK can be used to clock data through the input/output interface 106. In an example, a frequency of the internal clock signal CLK can be less than a frequency of a clock signal used by the memory controller 108 to communicate via the inter-device bus 110.

In an example, the command decoder 120 can decode commands, such as read commands, write commands, register set commands, activate commands, etc., and provide access to a particular one of the memory partitions 102 corresponding to the command, such as via an intra-package bus 124. The command decoder 120 can transmit various signals to one or more registers 126 via a bus path (e.g., one or more global wiring lines). In an example, the memory device 100 can include various other decoders, such as row decoders and column decoders, to facilitate access to the various memory partitions 102. In one embodiment, each memory partition 102 can include a respective control block 128 that provides decoding (e.g., row and/or column decoding), as well as other features, such as timing control and data control, to facilitate the execution of commands to and from the respective memory partition 102.

In an example, the command decoder 120 or other component in the memory device 100 can provide register commands to the one or more of the registers 126, which can be used in operations of each of the memory partitions 102, each control block 128, and the like. For example, one of the registers 126 can define various modes of programmable operations and/or configurations of the memory device 100. The registers 126 can be included in semiconductor devices to define operations for various types of memory components, such as FeRAM, DRAM, synchronous DRAM, chalcogenide memories (e.g., PCM) or other types of memories. The registers 126 can receive various signals from the command decoder 120 via wiring lines that can include a common data path, a common address path, a common write command signal path, or a common read command signal path. The wiring lines can traverse the memory device 100 and couple to each register 126.

The registers 126 can be accessed or otherwise accessible by the memory controller 108. The registers 126 can be dispersed across the memory device 100 and the registers can represent or contain information such as configuration settings of the memory device 100 and/or specific components therein, status information about the memory device 100 and/or specific components therein, memory device 100 parameters and/or specific parameters for components of the memory device 100, or predetermined patterns that can be written across the memory device (e.g., in one or more of the memory partitions 102). Thus, while the registers 126 are illustrated in FIG. 1, it should be appreciated that additional and/or alternative registers can be located elsewhere in the memory device and can be accessed by the memory controller 108 (i.e., when in operation, the registers are accessed by the memory controller 108). Such accesses by the memory controller 108 can include, for example, reads of the registers (e.g., read accesses) and/or writes to the registers (e.g., write accesses).

In an example, the memory device 100 executes operations, such as read commands and write commands, based on the command/address signals received from an external device, such as a processor and/or by the memory controller 108. In one example, command/address signals are clocked to the command interface 104 using clock signals. The command interface 104 can include a command/address input circuit 116 that is configured to receive and transmit the commands to provide access to the memory partitions 102, through the command decoder 120. The command interface 104 can receive memory select signals that enable the memory device 100 to process commands on the incoming command/address signals. Access to specific memory partitions 102 within the memory device 100 can be encoded in the commands.

The command interface 104 can be configured to receive various other command signals. For example, a reset command can be used to reset the command interface 104, status registers, state machines and the like, during power-up or standby exit, for instance. Various signals to facilitate testing of the memory device 100 may be provided. For instance, test signals can be used to place the memory device 100 into a test mode for connectivity testing. The command interface 104 can be used to provide an alert signal or other alarm signal to the system processor or controller for certain errors that may be detected. In some embodiments, the input/output interface 106 can additionally or alternatively transmit an alert signal, for example, a thermal alert.

Data can be sent to and from the memory device 100 using the command and clocking signals discussed above, for example, by transmitting and receiving data signals through the input/output interface 106. More specifically, the data can be sent to or retrieved from the memory partitions 102 over a data path 130, such as can include multiple bidirectional data buses. Data I/O signals, for example, can be transmitted and received in one or more bidirectional data busses to and from the input/output interface 106. For particular memory devices, such as a DDR5 SDRAM memory device, the I/O signals can be divided into upper and lower bytes; however, such segmentation is generally not used for other memory device types.

As will be appreciated, various other components such as power supply circuits (for receiving external VDD and VSS signals), read/write amplifiers (to amplify signals during read/write operations), temperature sensors (for sensing temperatures of the memory device 100), etc., can be incorporated with the memory device 100. Accordingly, it should be understood that the block diagram of FIG. 1 is only provided to highlight certain functional features of the memory device 100 to aid in the subsequent detailed description.

The memory controller 108 can include an error correction code (ECC) component 109, which can include, among other things, an ECC engine or other circuitry configured to detect or correct errors associated with writing data to or reading data from one or more memory cells of a memory device coupled to the memory controller 108. The memory controller 108 can be configured to actively detect and recover from error occurrences (e.g., bit errors, operation errors, etc.) associated with various operations or storage of data, while maintaining integrity of the data transferred between a host and a memory device, or maintaining integrity of stored data, and can remove (e.g., retire) failing memory resources (e.g., memory cells, memory arrays, pages, blocks, etc.) to prevent future errors.

Figure 2:
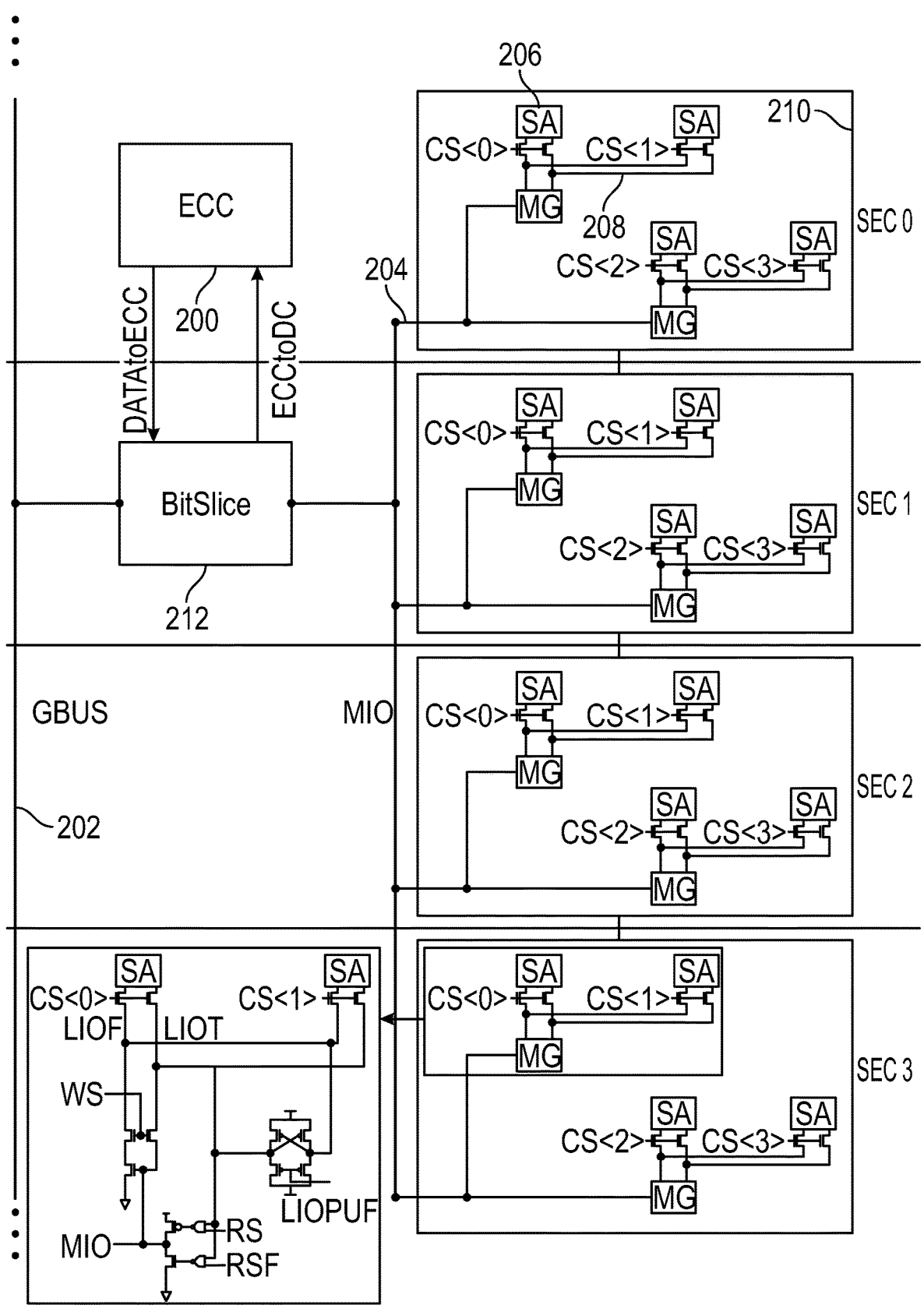
FIG. 2 illustrates data paths including error code correction for read and write operations in a bank area.

FIG. 2 illustrates data paths including error code correction for read and write operations in a bank area. The error code correction (ECC) 200 can detect or correct various data corruption or errors, and, in some cases, may recover data (e.g., during a read operation) before transmitting over the global bus (GBUS) 202. The data can first be received by the ECC (during read operations) over a main input/output (MIO) 204, wherein the MIO 204 receives the data from sense amplifiers 206 over local I/O (LIO) 208. Sense amplifiers 206 and LIO 208 can be provided per sector 210. Such error detection and correction may rely upon one or more error-correcting codes such as block codes, convolutional codes, Hamming codes, low-density parity-check codes, turbo codes, polar codes, and others. These processes, operations, and techniques may be referred to as ECC processes, as ECC techniques, as ECC operations, or simply as ECC.

In a read operation, for example, the ECC 200 may perform an error correction operation on data read from a memory array (e.g., as read or otherwise conveyed from memory cells) according to the read operation. The ECC 200 may generate corrected data (e.g., in a correction subcomponent) or an indication of a detected error (e.g., in a detection subcomponent). The ECC may output data, which, in various circumstances, may be the data read from the memory array, or data that has been corrected.

When a read command is received by the sense amplifier 206, the sense amplifier 206 outputs data to the bitslice area 212 and the bitslice area 212 drives data to the GBUS 202. GBUS data is connected to a channel area (not shown in FIG. 2). Other banks of a memory device may similarly share the same GBUS 202.

The same can happen in reverse, e.g., during a write operation. Data is received by the ECC 200 over the bus 202, where error correction is performed by the ECC 200. The data is then provided over the MIO 204 to local I/O 208 and sense amplifiers 206.

Regarding the bitslice 212, in some examples, sense amplifiers 206 may include a single amplifier for each signal path of a data bus (e.g., there may be a 1:1 correspondence between an amplifier and a memory cell of memory or bit of transferred information, a set of r amplifiers). Thus, the sense amplifier 206 may include one or more circuit elements for each memory cell, or each bit of information accessed in a memory array, involved in a given access operation. Such a granularity or regularity may be referred to as a "bitslice" 212, where each bit slice of the data path includes one or more circuit elements that are repeated for each bit or memory cell involved in an access operation.

ECC operations can add delays that affect operation of the memory device and user experience. These and other concerns are addressed in example embodiments through use of parallel pipe latch circuitry.

Figure 3:
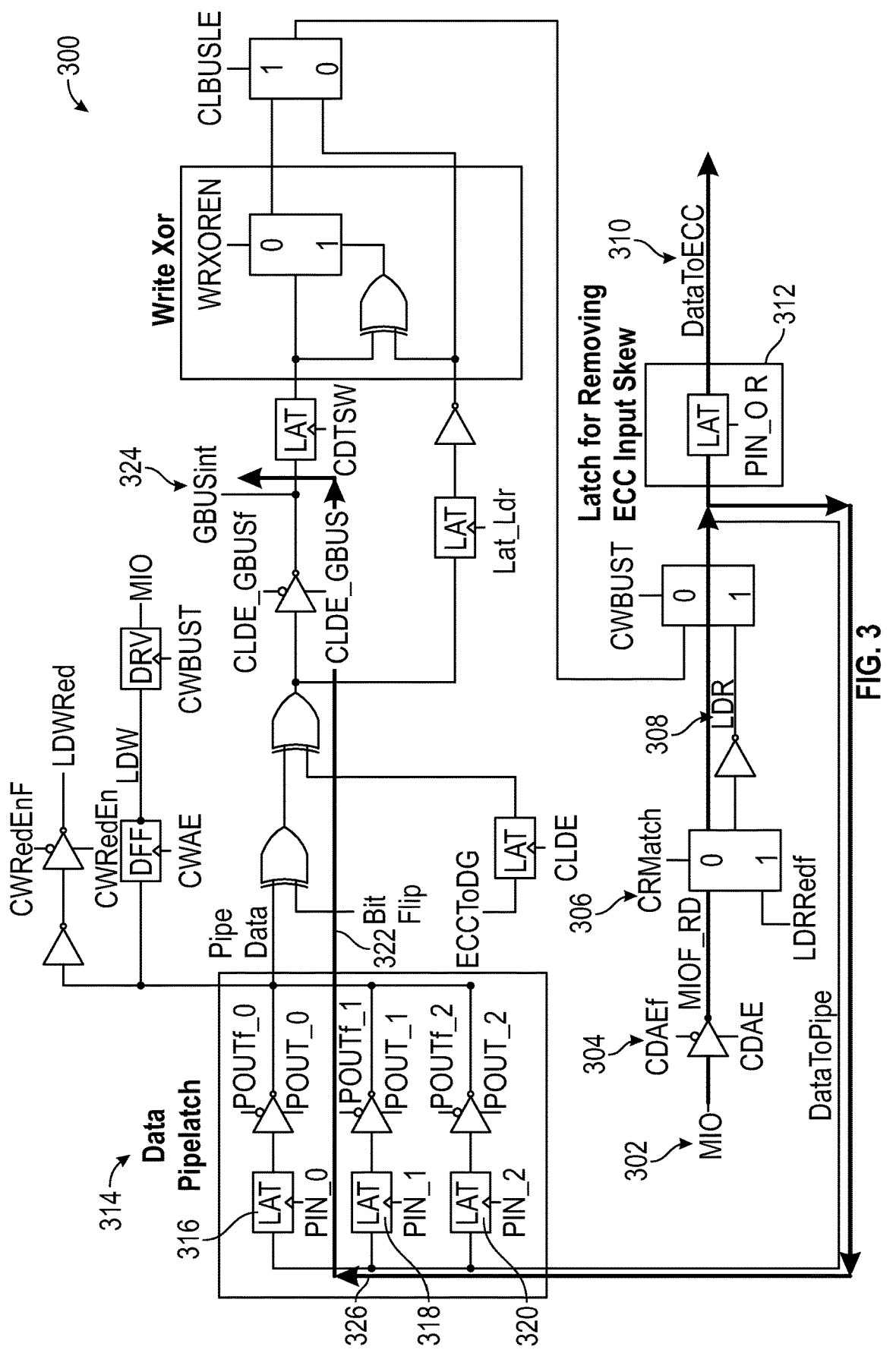
FIG. 3 illustrates a data path for a read operation in a bitslice area according to some embodiments.
Figure 4:
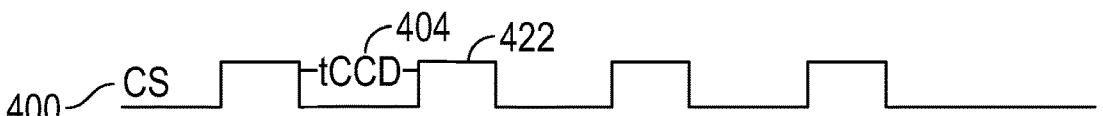
FIG. 4 illustrates signals for a read operation according to some embodiments.

FIG. 3 illustrates a data path for a read operation 300 in a bitslice (e.g., bitslic3 212 (FIG. 2)) area according to some embodiments. FIG. 4 illustrates signals for a read operation according to some embodiments. Reference is made to both FIG. 3 and FIG. 4 together to describe pipe latch during read operations according to various embodiment.

When read commands are inserted in the column select 400 pulse, read data commands are driven to the MIO at point 302 as seen at signal 402. The interval between CS 400 pulses is referred to hereinafter as tCCD 404. The read command data can be accepted by a strobe signal at CDAE 406 and block 304. When CDAE 406 is enabled, the data is accepted at the LDR line at signals 410 and 412 and block 306 and 308 and the data is inserted to the ECC block at DataToECC line 310 (FIG. 3) and 414 (FIG. 4) through a latch 312 (signal 415). Parity data is also provided to the ECC block with the data to be checked.

The ECC block 200 (FIG. 2) can then calculate whether there is any error. If there is error, a correction bit is set high and the original data is inverted to correct the error. After calculation, the ECC block 200 generates the ECC2DG signal 416. In available systems, the error is not corrected until the ECC is output at ECC2DG 416. However, as seen at point 418 because the calculation delay is very long compared to the tCCD interval 404, when the ECC2DG output arrives at CDLE_GBUS 419 at point 420 (for example) the second pulse 422 is already being received at the CS signal 400. Example embodiments address these and other concerns by providing pipe latch signals and pipe latches and data is maintained within the pipe latches at least until ECC2DG output arrives the CLDE_GBUS.

In the example illustrated in FIG. 4, data arrives at a first pipe at signal 422, and is latched within a pipe latch at 424 (or pipe latch 316 (FIG. 3)). Next subsequent data arrives at a second pipe at signal 426 and is latched within a pipe latch at 428 (or pipe latch 318 (FIG. 3)). Meanwhile, data can arrive at via ECC2DG 426 at the CLDE_GBUS 419 and, because original first data was maintained in the first pipe latch, the original first data is not lost and can be provided correctly to the CLDE_GBUS 419. Additional pipe signals and pipe latches can be provided, for example a third pipe at signal 430 and third pipe latch at 432 (or pipe latch 320 (FIG. 3)).

Data is output from the pipe latches by control of signals 434, 436, 438 (or, e.g., at path segment 322 (FIG. 3)) and from there to the GBUS at point 324. While three pipelatches are shown, embodiments are not limited to any particular number of pipe latches. Pipe latches are provided in parallel, as opposed to in series, for improvements in timing control. Furthermore, by providing parallel as opposed to series pipe latches, one pipe input (see e.g., point 326 (FIG. 3) and one pipe output are needed, rather than sequential multiple pipe inputs and pipe outputs.

Figure 5:
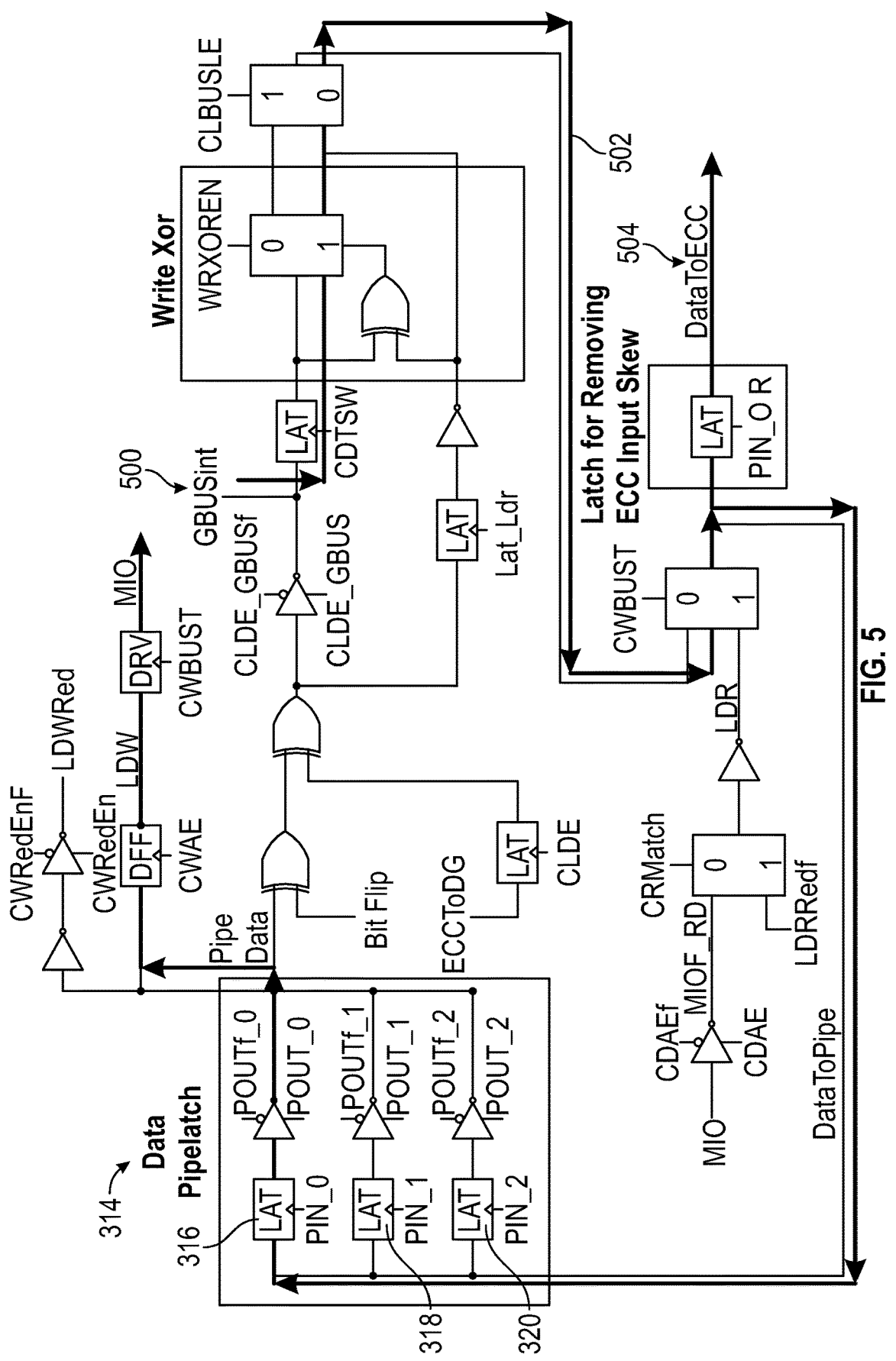
FIG. 5 illustrates a data path for a write operation in a bitslice area according to some embodiments.
Figure 6:
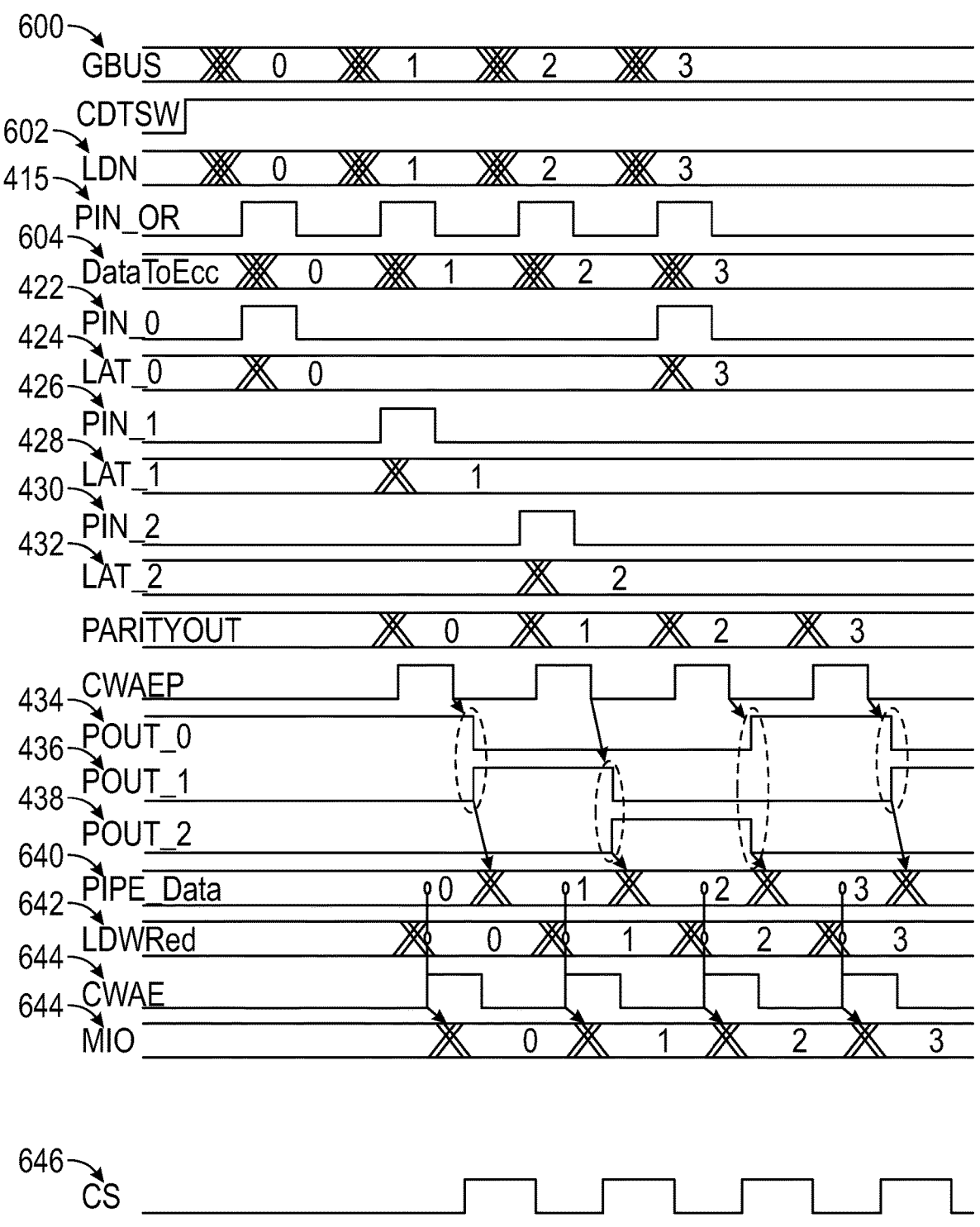
FIG. 6 illustrates signals for a write operation according to some embodiments.

Similar processing is performed for write commands. A same pipe latch circuitry can be provided and shared between read and write paths. FIG. 5 illustrates a data path for a write operation according to some embodiments. FIG. 6 illustrates signals for a write operation according to some embodiments. Reference is made to both FIG. 5 and FIG. 6 together to describe pipe latch during write operations according to various embodiments.

Data is received from the GBUS at point 500 (FIG. 5) at signal 600 (FIG. 6). The data to be written is provided to an ECC block over path 502, 504 (and signal 602, 604). At the same time, the data to be written is provided to a data pipe latch 314, which is the same data pipe latch as included for read operations, thereby reducing board layout area in memory systems configured according to example embodiments. Pipe data is output from the pipe latches and provided over MIO for writing to appropriate cells of memory.

For example, referring to FIG. 6, when first data is received for writing at the GBUS on signal 600, signal 422 can control a first pipe latch to store data as seen at signal 424. Similarly, for subsequent write operations, signal 426 can control the latch at signal 428 to store the next subsequent write data. Additional pipe control and pipe latch can be provided at signals 430 and 432. While three pipe latches are shown, embodiments are not limited thereto. Furthermore, it will be understood that the pipe latch circuitry and signals thereof are shared with similar read operations, such that one set of pipe latch circuitry and signals are used for all memory access operations.

Pipe data is provided at signal 640 and then strobed for writing using strobe signal 642, to MIO 644. Column select is then performed at 646 to write to the appropriate memory.

FIG. 7 illustrates a method 700 for accessing memory according to various embodiments. The method 700 can begin with operation 702 with receiving a command to access the memory.

The method 700 can continue with operation 704 with, responsive to receiving the command to access the memory, providing command data of the command to pipe latch circuitry and error correction code (ECC) circuitry. The commands can be processed according to data read path (FIG. 3) or data write path (FIG. 5) depending on the type of command received. The method 700 can continue with operation 706 with maintaining the command data within the pipe latch circuitry for a period of time of a duration longer than error calculation time of the ECC circuitry. As described earlier herein, command data is provided to a same set of pipe latch circuitry regardless of the type of memory access operation, which reduces circuitry layout area.

Figure 8:
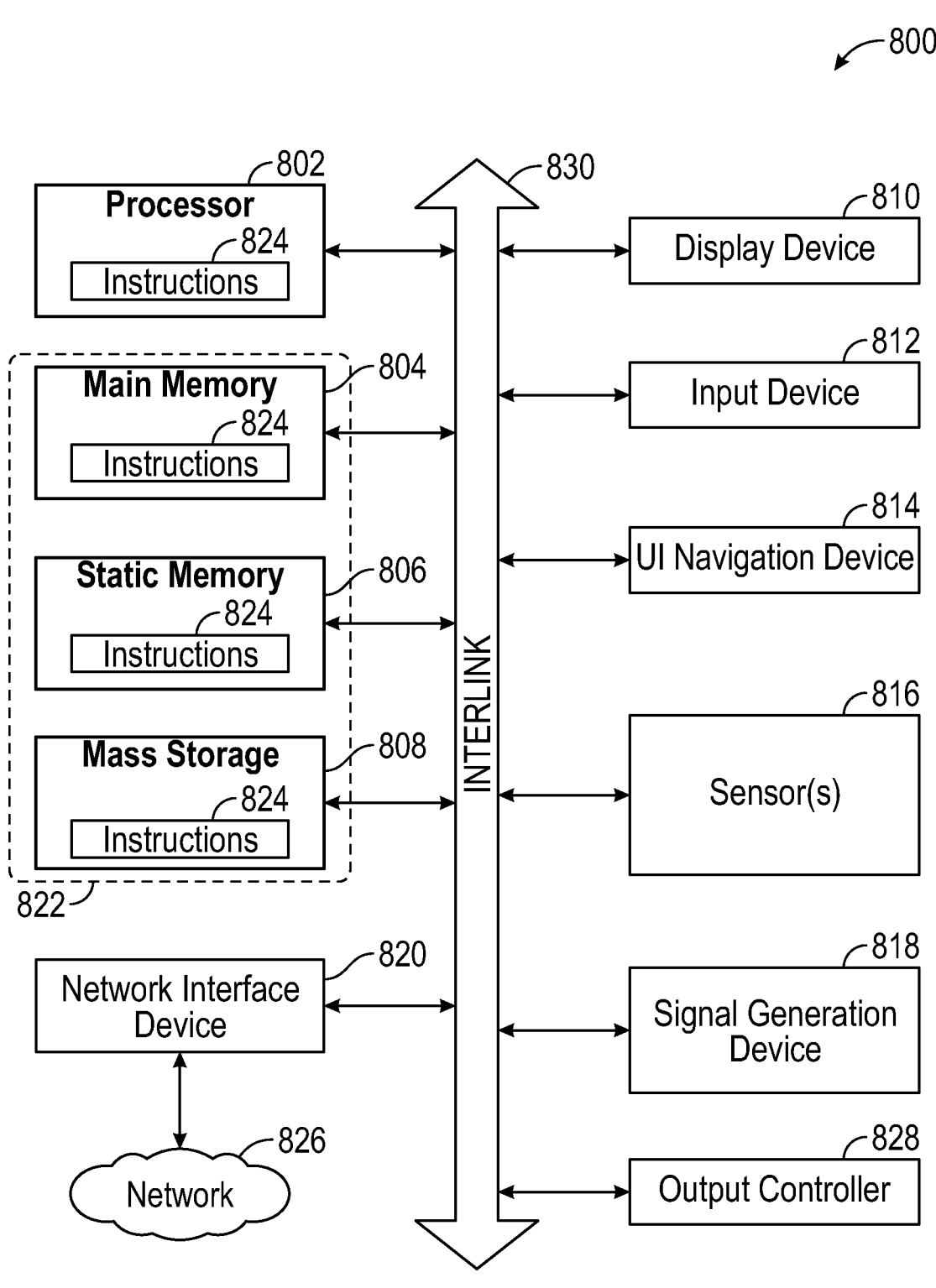
FIG. 8 illustrates a block diagram of an example machine with which, in which, or by which any one or more of the techniques discussed herein can be implemented.

FIG. 8 illustrates a block diagram of an example machine 800 with which, in which, or by which any one or more of the techniques (e.g., methodologies) discussed herein can be implemented. Examples, as described herein, can include, or can operate by, logic or a number of components, or mechanisms in the machine 800. Circuitry (e.g., processing circuitry) is a collection of circuits implemented in tangible entities of the machine 800 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

In alternative embodiments, the machine 800 can operate as a standalone device or can be connected (e.g., networked) to other machines. In a networked deployment, the machine 800 can operate in the capacity of a server machine, a client machine, or both in server-client network environments. In an example, the machine 800 can act as a peer machine in peer-to-peer (P2P) (or other distributed) network environment. The machine 800 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 800 (e.g., computer system) can include a hardware processor 802 or host device (e.g., the host device, a central processing unit (CPU), a graphics processing unit (GPU), a hardware processor core, or any combination thereof), a main memory 804, a static memory 806 (e.g., memory or storage for firmware, microcode, a basic-input-output (BIOS), unified extensible firmware interface (UEFI), etc.), and mass storage device 808 or memory die stack, hard drives, tape drives, flash storage, or other block devices) some or all of which can communicate with each other via an interlink 830 (e.g., bus). The machine 800 can further include a display device 810, an alphanumeric input device 812 (e.g., a keyboard), and a user interface (UI) Navigation device 814 (e.g., a mouse). In an example, the display device 810, the input device 812, and the UI navigation device 814 can be a touch screen display. The machine 800 can additionally include a mass storage device 808 (e.g., a drive unit), a signal generation device 818 (e.g., a speaker), a network interface device 820, and one or more sensor(s) 816, such as a global positioning system (GPS) sensor, compass, accelerometer, or another sensor. The machine 800 can include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 802, the main memory 804, the static memory 806, or the mass storage device 808 can be, or include a machine-readable media 822 on which is stored one or more sets of data structures or instructions 824 (e.g., software) embodying or used by any one or more of the techniques or functions described herein. The instructions 824 can also reside, completely or at least partially, within any of registers of the hardware processor 802, the main memory 804, the static memory 806, or the mass storage device 808 during execution thereof by the machine 800. In an example, one or any combination of the hardware processor 802, the main memory 804, the static memory 806, or the mass storage device 808 can constitute the machine-readable media 822. While the machine-readable media 822 is illustrated as a single medium, the term "machine-readable medium" can include a single medium or multiple media (e.g., a centralized or distributed database, or associated caches and servers) configured to store the one or more instructions 824.

The term "machine readable medium" can include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include: non-volatile memory, such as semiconductor memory devices (e.g., electrically programmable read-only memory (EPROM), electrically erasable programmable read-only memory (EEPROM)), ferroelectric random access memory (FeRAM)) and flash memory devices; magnetic disks, such as internal hard disks and removable disks; magneto-optical disks; and CD-ROM and DVD-ROM disks.

In an example, information stored or otherwise provided on the machine-readable media 822 can be representative of the instructions 824, such as instructions 824 themselves or a format from which the instructions 824 can be derived. This format from which the instructions 824 can be derived can include source code, encoded instructions (e.g., in compressed or encrypted form), packaged instructions (e.g., split into multiple packages), or the like. The information representative of the instructions 824 in the machine-readable media 822 can be processed by processing circuitry into the instructions to implement any of the operations discussed herein. For example, deriving the instructions 824 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 824.

In an example, the derivation of the instructions 824 can include assembly, compilation, or interpretation of the information (e.g., by the processing circuitry) to create the instructions 824 from some intermediate or preprocessed format provided by the machine-readable media 822. The information, when provided in multiple parts, can be combined, unpacked, and modified to create the instructions 824. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 824 can be further transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 can include one or more physical jacks (e.g., Ethernet, coaxial, or phone jacks) or one or more antennas to connect to the network 826. In an example, the network interface device 820 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software. A transmission medium is a machine readable medium.

To better illustrate the methods and apparatuses described herein, a non-limiting set of Example embodiments are set forth below as numerically identified Examples.

Example 1 includes memory device comprising: memory; control circuitry configured to: receive a command to access the memory; and responsive to receiving the command to access the memory, provide command data of the command to pipe latch circuitry and error correction code (ECC) circuitry; and pipe latch circuitry configured to receive command data of the command from the control circuitry; and maintain the command data for a period of time of a duration longer than error calculation time of the ECC circuitry.

In Example 2, the subject matter of Example 1 can include wherein the pipe latch circuitry includes at least three pipe latches.

In Example 3, the subject matter of Example 2 can include wherein the at least three pipe latches are parallel to each other.

In Example 4, the subject matter of any one or more of Examples 1-3 can include wherein the pipe latch circuitry is configured to handle both read command data and write command data within one set of pipe latches.

In Example 5, the subject matter of any one or more of Examples 1-4 can include wherein the pipe latch circuitry is within a bank area of the memory.

In Example 6, the subject matter of any one or more of Examples 1-5 can include wherein the memory comprises dynamic random access memory (DRAM).

In Example 7, the subject matter of any or more of Examples 1-6 can include wherein the memory comprises ferroelectric random access memory (FeRAM).

In Example 8, the subject matter of Example 6 can include wherein the memory comprises a plurality of banks.

Example 9 is a system comprising: a host device; a memory device coupled to the host device, the memory device comprising: memory; control circuitry configured to: receive a command to access the memory; and responsive to receiving the command to access the memory, provide command data of the command to pipe latch circuitry and error correction code (ECC) circuitry; and pipe latch circuitry configured to receive command data of the command from the control circuitry; and maintain the command data for a period of time of a duration longer than error calculation time of the ECC circuitry.

In Example 10, the subject matter of Example 9 can include wherein the pipe latch circuitry includes at least three pipe latches.

In Example 11, the subject matter of Example 10 can include wherein the at least three pipe latches are parallel to each other.

In Example 12, the subject matter of Example 10 can include wherein the pipe latch circuitry is configured to handle both read command data and write command data within one set of pipe latches.

In Example 13, the subject matter of any one or more of Examples 9-12 can include wherein the pipe latch circuitry is within a bank area of the memory.

In Example 14, the subject matter of any one or more of Examples 9-13 can include wherein the memory comprises dynamic random access memory (DRAM).

In Example 15, the subject matter of any one of Examples 9-14 can include wherein the memory comprises ferroelectric random access memory (FeRAM).

In Example 16, the subject matter of any one or more of Examples 9-15 can include wherein the memory comprises a plurality of banks.

Example 17 is a method for accessing memory, the method comprising: receiving a command to access the memory; and responsive to receiving the command to access the memory, providing command data of the command to pipe latch circuitry and error correction code (ECC) circuitry; and maintaining the command data within the pipe latch circuitry for a period of time of a duration longer than error calculation time of the ECC circuitry.

In Example 18, the subject matter of Example 17 can include wherein the command to access memory comprises either a read command or a write command.

In Example 19, the subject matter of Example 18 can include providing the command data to a same set of pipe latch circuitry for both a read command and a write command.

In Example 20, the subject matter of any one or more of Examples 17-19 includes providing read data from the pipe latch circuitry to a global bus for further processing.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory device comprising:
memory configured to store electronic data;
pipe latch circuitry; and
control circuitry configured to:
receive a memory access command to access multiple bits of the electronic data stored in the memory; and
responsive to receiving the memory access command to access the memory, provide one of data read from the memory as read command data or data to be written to the memory as write command data from the control circuitry to the pipe latch circuitry and to error correction code (ECC) circuitry;
wherein the pipe latch circuitry includes multiple parallel pipe latches in a bitslice area of the memory, wherein each respective bitslice area includes one or more circuit elements that are repeated for each bit associated with the memory access command, and wherein the multiple parallel pipe latches are configured to maintain the read command data or the write command data for different sequential memory access operations transferred via a shared data path, and wherein the pipe latch circuitry is configured to:
receive, via the shared data path, the read command data or the write command data from the control circuitry;
operate the multiple parallel pipe latches in parallel to handle consecutive memory access commands with a fixed timing interval between commands;
for write operations, latch the write command data while the ECC circuitry determines an error correction code; and
for read operations, latch the read command data while the ECC circuitry performs an error correction operation, and maintain the read command data for a duration longer than a time to perform the error correction operation.

2. The memory device of claim 1, wherein the pipe latch circuitry includes at least three pipe latches.

3. The memory device of claim 2, wherein the at least three pipe latches are parallel to each other.

4. The memory device of claim 2, wherein the pipe latch circuitry is configured to handle both the read command data and the write command data within one set of pipe latches.

5. The memory device of claim 1, wherein the pipe latch circuitry is within a bank area of the memory.

6. The memory device of claim 1, wherein the memory comprises dynamic random access memory (DRAM) or ferroelectric random access memory (FeRAM).

7. The memory device of claim 1, wherein the bitslice area of the memory is located outside a memory array area of the memory.

8. The memory device of claim 6, wherein the memory comprises a plurality of banks.

9. A system comprising:
a host device;
a memory device coupled to the host device, the memory device comprising:
memory;
pipe latch circuitry; and
control circuitry configured to:
receive a memory access command to access multiple bits of electronic data stored in the memory; and responsive to receiving the memory access command to access the memory, provide one of data read from the memory as read command data or data to be written to the memory as write command data from the control circuitry to the pipe latch circuitry and to error correction code (ECC) circuitry;
wherein the pipe latch circuitry includes multiple parallel pipe latches in a bitslice area of the memory, wherein each respective bitslice area includes one or more circuit elements that are repeated for each bit associated with the memory access command, and wherein the multiple parallel pipe latches are configured to maintain the read command data or the write command data for different sequential memory access operations transferred via a shared data path, and wherein the pipe latch circuitry is configured to:
receive, via the shared data path, the read command data or the write command data from the control circuitry;
operate the multiple parallel pipe latches in parallel to handle consecutive memory access commands with a fixed timing interval between commands;
for write operations, latch the write command data while the ECC circuitry determines an error correction code; and
for read operations, latch the read command data while the ECC circuitry performs an error correction operation, and maintain the read command data for a period of time of a duration longer than error calculation time of the ECC circuitry.

10. The system of claim 9, wherein the pipe latch circuitry includes at least three pipe latches.

11. The system of claim 10, wherein the at least three pipe latches are parallel to each other.

12. The system of claim 10, wherein the pipe latch circuitry is configured to handle both the read command data and the write command data within one set of pipe latches.

13. The system of claim 9, wherein the pipe latch circuitry is within a bank area of the memory.

14. The system of claim 9, wherein the memory comprises dynamic random access memory (DRAM).

15. The system of claim 9, wherein the memory comprises ferroelectric random access memory (FeRAM).

16. The system of claim 13, wherein the memory comprises a plurality of banks.

17. A method for accessing memory, the method comprising:
receiving, at control circuitry, a memory access command to access multiple bits of electronic data stored in the memory; and
responsive to receiving the memory access command to access the electronic data stored in the memory, providing, via the control circuitry, command data of the command to pipe latch circuitry and to error correction code (ECC) circuitry,
wherein the pipe latch circuitry includes multiple parallel pipe latches in a bitslice area of the memory, wherein each respective bitslice area includes one or more circuit elements that are repeated for each bit associated with the memory access command, and wherein the multiple parallel pipe latches are configured to handle read command data and write command data for different sequential memory access operations transferred via a shared data path, and wherein the read command data comprises data read from the memory, and wherein the write command data comprises data to be written to the memory;

receiving, at the pipe latch circuitry and from the control circuitry using a shared data path, the read command data or the write command data;

operating the multiple parallel pipe latches in parallel to handle consecutive memory access commands with a fixed timing interval between commands;

for write operations, latching the write command data in one or more of the parallel pipe latches of the pipe latch circuitry while the ECC circuitry determines an error correction code;

for read operations, latching the read command data in one or more of the parallel pipe latches of the pipe latch circuitry while the ECC circuitry performs an error correction operation; and maintaining the read command data within the pipe latch circuitry for a period of time of a duration longer than error calculation time of the ECC circuitry.

18. The method of claim 17, wherein the memory access command to access memory comprises either a read command or a write command.

19. The method of claim 18, further comprising providing the read command data or the write command data to a same set of pipe latch circuitry for both a read command and a write command.

20. The method of claim 17, further comprising providing read data from the pipe latch circuitry to a global bus for further processing.

* * * * *